(12) United States Patent
Ma et al.

(10) Patent No.: US 7,280,332 B2
(45) Date of Patent: Oct. 9, 2007

(54) ON-CHIP ESD PROTECTION CIRCUIT FOR COMPOUND SEMICONDUCTOR HETEROJUNCTION BIPOLAR TRANSISTOR RF CIRCUITS

(75) Inventors: Yin Tat Ma, Diamond Bar, CA (US); Guann-Pyng Li, Irvine, CA (US)

(73) Assignee: The Regents of The University of California, Oakland, CA (US)

( * ) Notice: Subject to any disclaimer, the term of this patent is extended or adjusted under 35 U.S.C. 154(b) by 39 days.

(21) Appl. No.: 10/501,651

(22) PCT Filed: Jan. 16, 2003

(86) PCT No.: PCT/US03/01420

§ 371 (c)(1),
(2), (4) Date: Jan. 10, 2005

(87) PCT Pub. No.: WO03/063203

PCT Pub. Date: Jul. 31, 2003

(65) Prior Publication Data

US 2005/0122644 A1    Jun. 9, 2005

Related U.S. Application Data

(60) Provisional application No. 60/349,899, filed on Jan. 18, 2002.

(51) Int. Cl.
*H02H 3/20* (2006.01)
*H02H 9/04* (2006.01)
(52) U.S. Cl. .................................... 361/91.1
(58) Field of Classification Search ................ 361/91.1
See application file for complete search history.

(56) References Cited

U.S. PATENT DOCUMENTS

| 3,755,751 | A | * | 8/1973 | Ring ........................... 330/298 |
| 5,774,318 | A | * | 6/1998 | McClure et al. .............. 361/56 |
| 5,945,713 | A | * | 8/1999 | Voldman ..................... 257/355 |
| 6,529,059 | B1 | * | 3/2003 | Davis .......................... 327/310 |
| 6,549,061 | B2 | * | 4/2003 | Voldman et al. ............. 327/483 |
| 6,600,356 | B1 | * | 7/2003 | Weiss .......................... 327/310 |
| 6,624,999 | B1 | * | 9/2003 | Johnson ....................... 361/113 |
| 2002/0130392 | A1 | * | 9/2002 | Brennan et al. ............. 257/616 |

* cited by examiner

*Primary Examiner*—Michael Sherry
*Assistant Examiner*—Dharti H. Patel
(74) *Attorney, Agent, or Firm*—Myers Dawes Andras & Sherman LLP (57) ABSTRACT

A low loading capacitance on-chip electrostatic discharge (ESD) protection circuit for compound semiconductor power amplifiers is disclosed, which does not degrade the circuit RF performance. Its principle of operation and simulation results regarding capacitance loading, leakage current, degradation to RF performance are disclosed. The design, loading effect over frequency, robustness over process and temperature variation and application to an RF Power amplifier is presented in detail. The ESD circuit couples an input to ground during ESD surges through a diode string coupled to the input, and a transistor switch or Darlington pair having its gate coupled to and triggered by the diode string. The Darlington pair couples the input to ground when triggered through a low impedance path in parallel to the diode string. A reverse diode also couples ground to the input on reverse surges.

9 Claims, 13 Drawing Sheets

Diode String

Fig. 13b

Darlington Pair

100x100μm²
Darlington Pair
ESD Protection Circuit

200x200μm²
Diode String (*Prior Art*)
ESD Protection Circuit

ON-CHIP ESD PROTECTION CIRCUIT FOR COMPOUND SEMICONDUCTOR HETEROJUNCTION BIPOLAR TRANSISTOR RF CIRCUITS

RELATED APPLICATIONS

The application is related to U.S. Provisional Patent Application Ser. No. 60/349,899, filed on Jan. 18, 2002, which is incorporated herein by reference and to which priority is claimed pursuant to 35 USC 119.

BACKGROUND OF THE INVENTION

1. Field of the Invention

The invention relates to the field of electrostatic discharge (ESD) protection circuits and in particular to a low loading capacitance on-chip electrostatic discharge (ESD) protection circuit for compound semiconductor (such as GaAs, InP, SiGe etc) heterojunction bipolar transistor RF circuits.

2. Description of the Prior Art

Compound semiconductor heterojunction bipolar transistors (HBT) are attractive for RF integrated circuits (RFIC). For example, due to the high electron mobility, high current gain, low base resistance, and low loss semi-insulated substrate, a GaAs heterojunction bipolar transistor is advantageous for high frequency and high power application, such as power amplifiers for hand held phones. Even with a 2 μm width, GaAs heterojunction bipolar transistors have unity current gain bandwidth of 40 GHz and a maximum oscillation frequency of 90 GHz. In addition, high Early voltage, high breakdown voltage, and low knee voltage of this technology are ideal for power amplifiers for high output power and good linearity.

Figure 1:
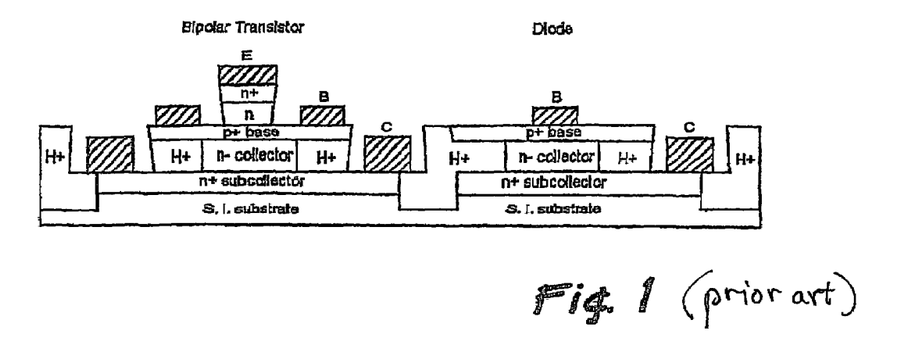
FIG. 1 is a diagrammatic side cross-sectional view of a prior art heterojunction bipolar transistor of the type which is commonly used in power amplifiers for which ESD protection of the invention is advantageous.

A GaAs heterojunction bipolar transistor is fabricated on a GaAs semi-insulated substrate. The epitaxy active layers of the heterojunction bipolar transistor are grown on the substrate using metal organic chemical vapor deposition (MOCVD) or molecular beam epitaxy (MBE) as shown in FIG. 1. For the ESD protection circuit, a diode is a common component. Because the GaAs diode is epi-grown on a semi-insulated substrate, the diode does not have a leakage problem like the silicon diode. The thin epitaxy active layers are prone to damages from an ESD event. To reduce chip loss due to ESD events during human and machine handling, on-chip ESD protection circuit is needed.

The ESD protection circuit should have low capacitance loading so the circuit RF performance is not affected. The capacitance loading from the ESD protection circuit can affect power gain, linearity, and bandwidth.

An ESD protection circuit is comprised of a positive threshold voltage clamp and a negative threshold voltage clamp. Each clamp turns on and sinks the ESD current at a preset voltage. The positive threshold voltage clamp design should take into consideration the voltage swing of the signal, whereas the negative threshold voltage clamp does not need such a requirement. The positive threshold voltage clamp must be designed to sink ESD current at a preset voltage, while the negative threshold voltage clamp can be designed to sink ESD current at any voltage before device breakdown. The negative threshold voltage clamp simply can be a reverse diode.

Figure 2:
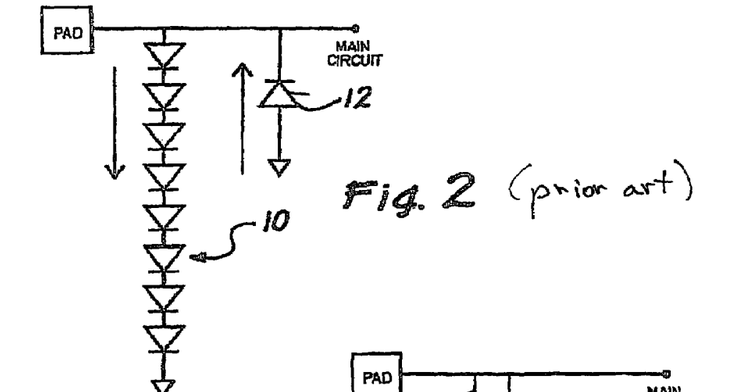
FIG. 2 is a schematic diagram which is used in the prior art for ESD protection of the transistor of the type shown in FIG. 1.

Among various RF circuits, power amplifiers have stringent design requirements in both ESD protection and RF performance. In this invention, the ESD protection circuit is designed to meet such requirements and can be also used in other RF circuits. The current ESD protection circuit used by the GaAs power amplifier community is a diode string 10 as shown in FIG. 2. This ESD protection circuit consists of a diode string 10 and a reverse diode 12. During a positive ESD surge, the diode string 10 turns on and sinks the ESD current. The number of diodes in the string 10 determines the headroom allowed for the signal. Eight diodes are shown here for 10V headroom operation. During a negative ESD surge, the reverse diode 12 turns on and sinks the ESD current. The major drawback of the ESD protection circuit of FIG. 2 is that the size of the diodes in the string 10 needs to be big in order to reduce the parasitic resistance.

Figure 3:
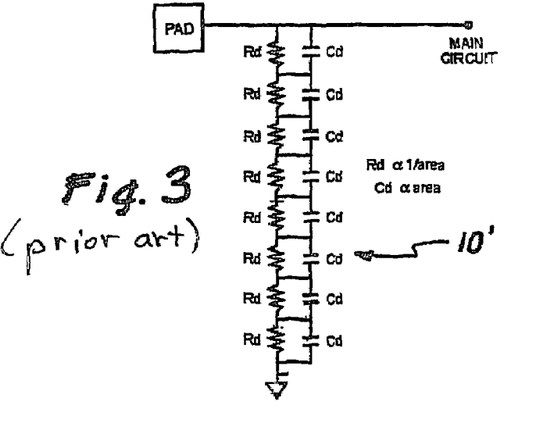
FIG. 3 is an equivalent circuit of the circuit of FIG. 2 for low frequencies during an ESD surge.

FIG. 3 illustrates this problem by a low frequency model of this ESD protection circuit during a positive ESD surge. For low frequency, the diode string 10 can be represented by a series of resistors 10' during a positive ESD surge; the resistance value is inversely proportional to the area of the diode in string 10. The resistance value of the diode in string 10 is typically 3.7 ohm for a 100 $\mu m^2$ emitter area. During a 2KV ESD event, approximately 1.3 Amp of ESD peak current sinks through the series resistors 10'. Because of this significant amount of ESD peak current sunk through the resistance 10', the pad voltage might be well over the breakdown voltage of the active devices in the main circuits.

Figure 4:
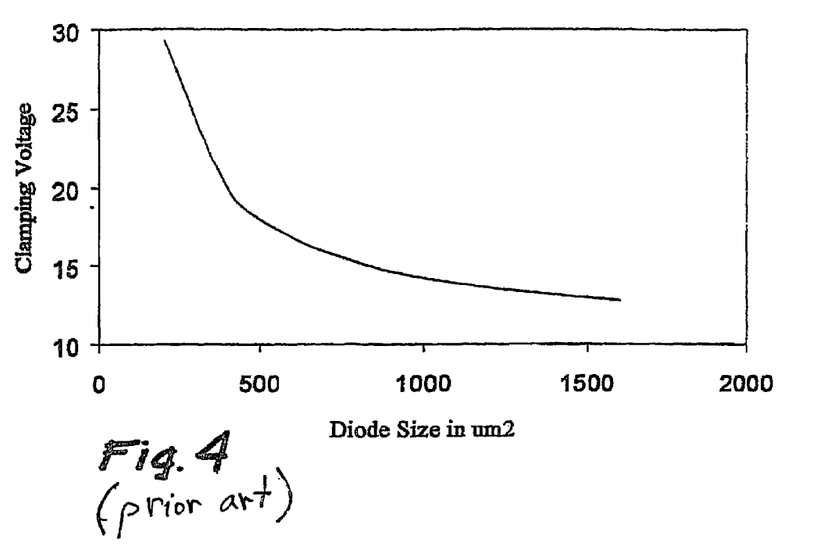
FIG. 4 is a graph of the clamping voltages of an 8-diode string of the design shown in FIG. 2 for 2000 $V_{ESD}$.

FIG. 4 shows clamping voltage for an 8-diode string 10 versus diode size for a +2000$V_{ESD}$. To have an acceptable clamping voltage, the size of each diode required is 1600 $\mu m^2$, which takes up too large an area. Currently in the power amplifier community, diode size of 100 $\mu m^2$ is used for the diode string 10. The small size is necessary because of smaller chip area and lower capacitance loading. For this diode size, the diode string 10 can protect against only about 200$V_{ESD}$.

What is needed is an ESD protection circuit and methodology which is not subject to these limitations of the prior art.

BRIEF SUMMARY OF THE INVENTION

The illustrated embodiment of the invention is an electrostatic discharge protection circuit coupled to ground comprising an input, a diode string coupled to the input, and a transistor switch having its gate coupled to the diode string. The transistor switch couples the input to ground when triggered through a low impedance path in parallel to the diode string. A reverse diode also couples ground to the input. It should be understood that the invention can be commercially implemented in many forms. For example, the invention could be fabricated and sold as an ESD protected bonding pad by chip foundries to be provided on any chip with any kind of RF circuit. On the other hand, the invention can also be used a design element in integrated circuit technologies by circuit designers.

In the preferred embodiment the switching transistor comprises a Darlington pair, although a bipolar transistor may be employed as an alternative.

The electrostatic discharge protection circuit further comprises a capacitance element in series with the switching transistor to reduce the capacitance contributed by the switching transistor. Again in the preferred embodiment the switching transistor comprises a Darlington pair and the capacitance element comprises a diode.

A series diode is coupled to the gate of the transistor switch and the diode string; and a series resistor is coupled between the series diode and ground. The order of the series diode and the series resistor can be interchanged.

The diode string is forward biased on the application of positive ESD events at the input and the reverse diode is forward biased on the application of negative ESD events at the input.

The invention can also be characterized as a method for providing electrostatic discharge protection comprising the steps of sinking a first type of ESD event to ground from an input through a diode string coupled to the input by triggering a transistor switch having its gate coupled to the diode string, the transistor switch coupling the input to ground in parallel to the diode string. A second type of ESD event is sunk through a reverse diode coupling ground to the input. In the illustrated embodiment the first type of ESD event is a positive voltage surge applied to the input, and the second type of ESD event is a negative voltage surge applied to the input, although the invention contemplates the reverse ESD polarity as also being within its scope. In such a case the topology of the circuit is altered according to conventional principles to perform analogously with the opposite ESD polarities, i.e. the bias direction of the diodes and transistors are reversed.

Again the triggering of the transistor switch preferably comprises triggering a Darlington pair. The triggering of the Darlington pair comprises coupling the first type of ESD event through the diode string to the gate of the Darlington pair while also coupling the first type of ESD event through the diode string to a series diode and resistor to ground to prevent the ESD protection circuit from turning on during low to moderate RF power operation, therefore minimizing leaking current and improving linearity.

The method further comprises coupling the input to ground during ESD protection by means of a capacitive element, such as a diode, in series with the transistor switch or Darlington pair to reduce the capacitance contributed from the transistor switch.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 8 is a schematic diagram of yet another one of the principles used in the ESD protection circuit of FIG. 5 pertaining to a diode and resistance in series to reduce power consumption, and nonconducting before the diode turns on.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

As illustrated in one of the compound semiconductor heterojunction bipolar transistor (HBT) technology, a low loading capacitance on-chip electrostatic discharge (ESD) protection circuit for GaAs power amplifiers is disclosed, which does not degrade the circuit RF performance. The similar method can be applied to other technologies included InP, SiGe, etc., Its principle of operation and simulation results regarding capacitance loading, leakage current, degradation to RF performance are disclosed. The design, loading effect over frequency, robustness over process and temperature variation and application to an RF power amplifier is presented in detail. The ESD circuit couples an input to ground during ESD surges through a diode string coupled to the input, and a transistor switch or Darlington pair 16 having its gate coupled to and triggered by the diode string. The Darlington pair 16 couples the input to ground when triggered through a low impedance path in parallel to the diode string. A reverse diode also couples ground to the input on reverse surges.

Figure 5:
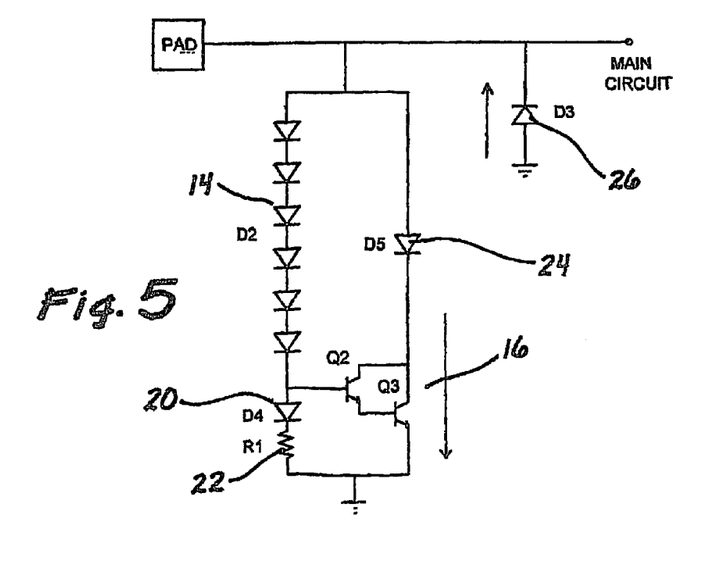
FIG. 5 is a schematic of the ESD protection circuit of the invention.
Figure 14:
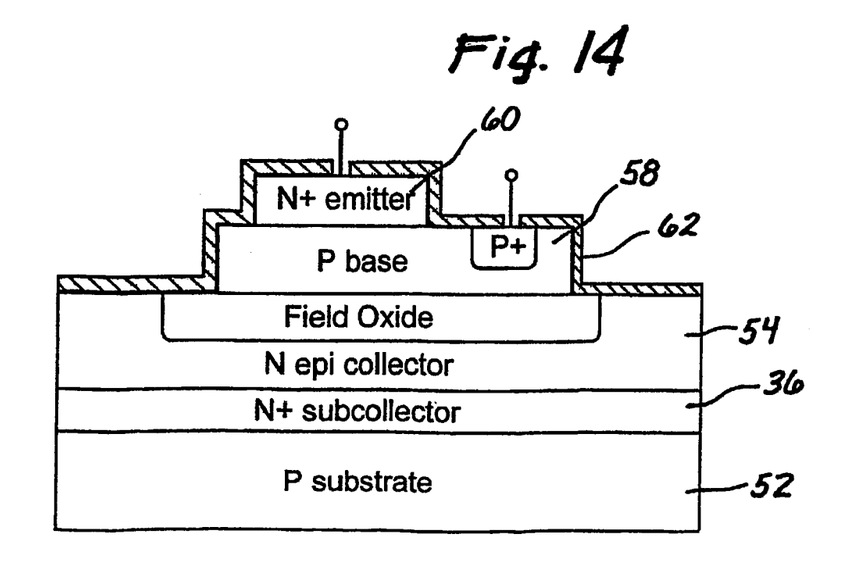
FIG. 14 is a diagrammatic side cross-sectional view of an isolated implanted diode using a base-emitter (BE) junction in SiGe.

The ESD protection circuit of the invention uses a diode string 14 to trigger a Darlington pair 16 as shown in FIG. 5. Either base-collector (BC) junction diodes or base-emitter (BE) junction diodes can be used, depending on which one has a lower capacitance. They can be either epi diodes in GaAs or InP HBT technology or isolated implanted diodes in SiGe HBT technology. FIG. 14 is a diagrammatic side cross-sectional view of an isolated implanted diode using a BE junction for SiGe. A p-type substrate 52 is covered by an n+ type subcollector layer 36 and an epi n-type layer 54 into which a field oxide well 56 is defined. P-type base 58 is disposed on field oxide well 56 and n+ emitter 60 is disposed on base 58. The entire device is passivated with insulating layer 62. For the case of SiGe HBT technology, the SiGe BE junction diode string together with SiGe HBTs Darlington pairs using the circuit topology as illustrated in FIG. 5 will form the on-chip ESD protection circuit for the SiGe HBT power amplifier.

Figure 15:
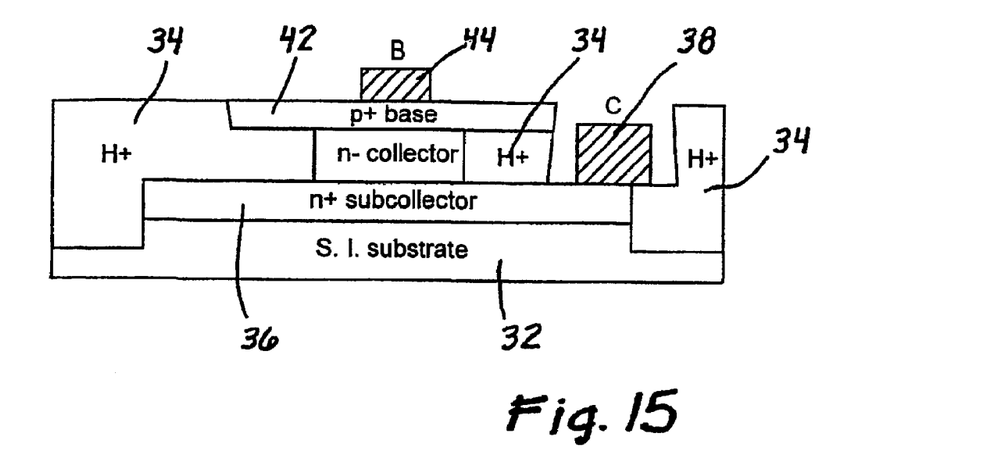
FIG. 15 is a diagrammatic side cross-sectional view of an epi diode using a base-collector (BC) junction in GaAs or InP.

For GaAs or InP the diodes are fabricated with epi layers using either MOCVD or MBE, therefore the diodes are isolated. FIG. 15 is a diagrammatic side cross-sectional view of an epi diode using a BC junction diode for GaAs or InP. Here a semi-insulating (S.I.) substrate 32 supports an n+ subcollector layer 36. Subcollector layer 36 is partially masked by ion implanted H⁺ layer 34 to define an n– collector layer 40 thereon. A p+ base 42 is disposed on collector 40 with a metal base contact 44. A metal collector contact 38 is disposed on subcollector layer 36.

Figure 16:
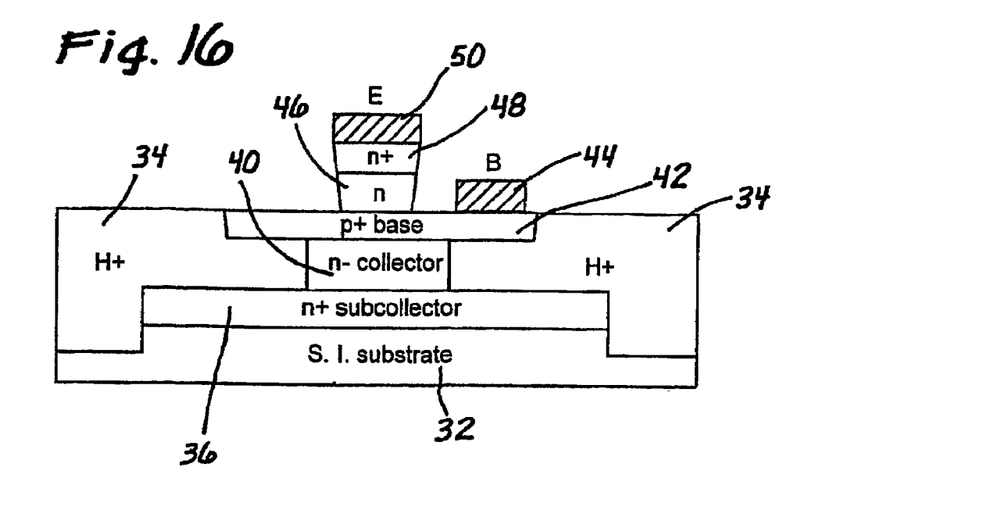
FIG. 16 is a diagrammatic side cross-sectional view of an epi diode using a base-emitter (BE) junction in GaAs or InP.

FIG. 16 is a diagrammatic side cross-sectional view of an epi diode using a BE junction diode for GaAs or InP. It has the same structure as shown for the diode in FIG. 15 except that a n-type emitter layer 46 is disposed on base 42, an n+ layer 48 on layer 46 followed by a metal emitter contact 50. Base contact 44 is disposed directly onto base layer 42.

Figure 6:
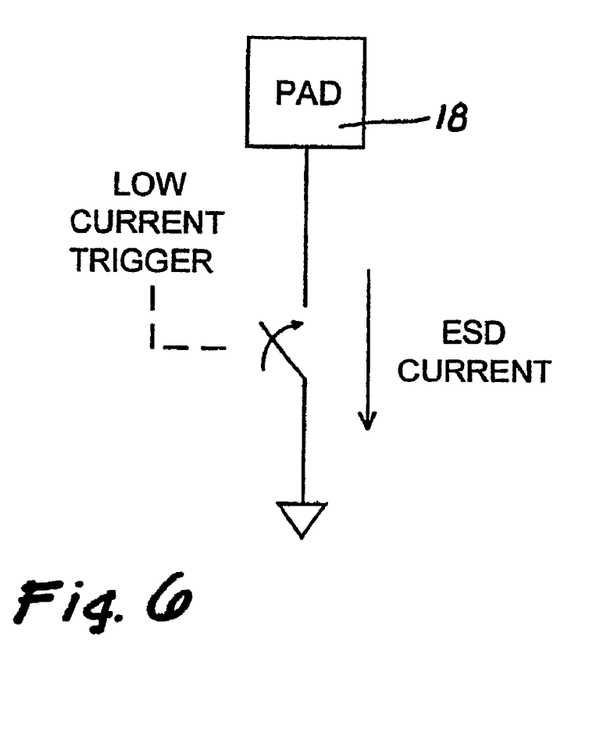
FIG. 6 is a schematic diagram of one of the principles used in the ESD protection circuit of FIG. 5 pertaining to a low current trigger for a high current device.
Figure 7:
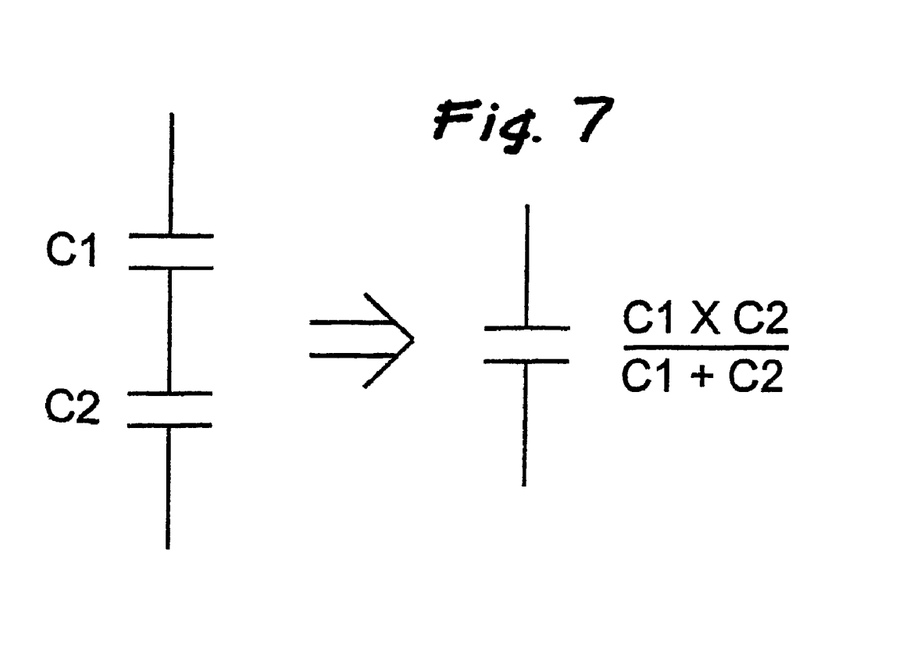
FIG. 7 is a schematic diagram of another one of the principles used in the ESD protection circuit of FIG. 5 pertaining to the reduction of capacitances in series.
Figure 8:
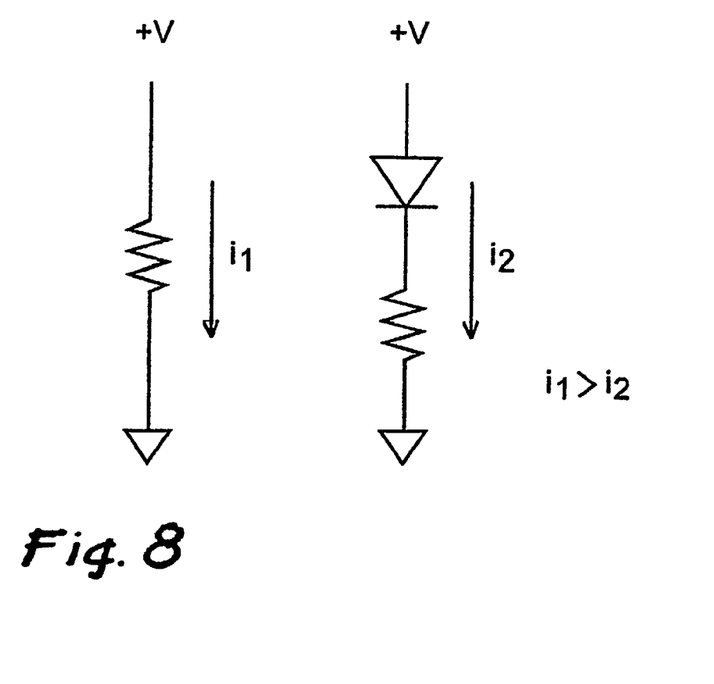
Figure 9:
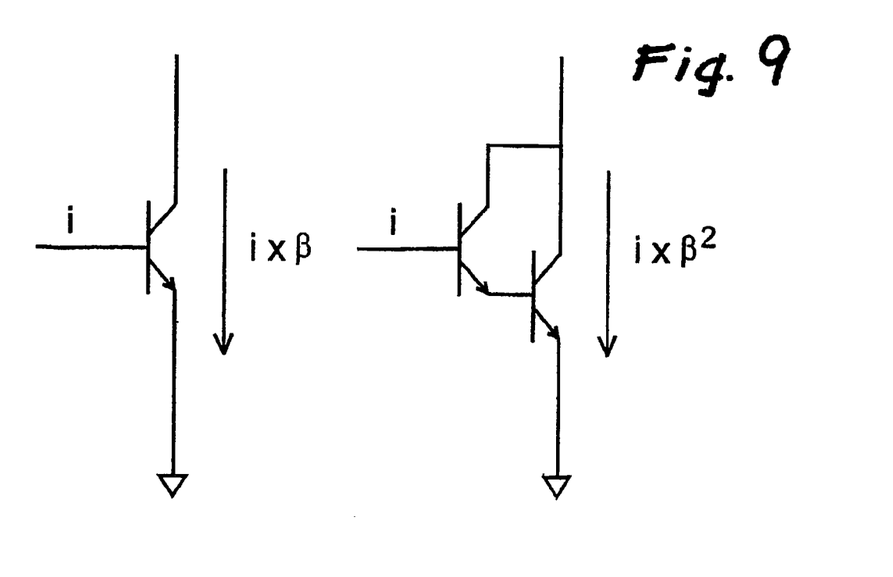
FIG. 9 is a schematic diagram of still another one of the principles used in the ESD protection circuit of FIG. 5 pertaining to a Darlington pair to reduce current drive and process sensitivity.

This approach is based on a combination of the following ideas:
(i) Using a low current device to trigger a high current device as illustrated in FIG. 6;
(ii) Using two capacitors in series to reduce total capacitance as illustrated in FIG. 7;
(iii) Using a diode and resistor in series to reduce power consumption and using the fact of nonconductance before the diode turns on as illustrated in FIG. 8;
(iv) Using a Darlington pair to increase current drive and reduce process and temperature sensitivity as illustrated in FIG. 9; and/or
(v) Implementing this circuit with the existing process and without new process steps.

The combination of these ideas can be seen in the ESD protection circuit of FIG. 5, which is based on the Darlington pair 16 for sinking the peak ESD current. Referring to FIG. 5, any positive ESD surge on the pad 18 would turn on the diode string 14. The voltage drop across diode 20 and a resistor 22 in series turns on the Darlington pair 16. The Darlington pair 16 then sinks the ESD current to ground. The Darlington pair 16 is used as a low impedance path for the ESD current to protect the main circuit. This circuit approach is a two-step process. The diode string 14 serves as a trigger to turn on the Darlington pair 16. The number of diodes in the string 14 and the resistor 22 and diode 20 in combination determine the preset voltage that turns on the Darlington pair 16. For low to moderate RF power operation, resistor 22 and diode 20 prevent this ESD protection circuit from turning on, therefore minimizing leaking current and improving linearity. The purpose of diode 24 parallel to string 14 and in series with the Darlington pair 16 is to reduce the capacitance contributed from the Darlington pair 16. When two capacitors, C1 and C2, are coupled in series as diagrammatically depicted in FIG. 7, the total capacitance is $C=(C1*C2)/(C1+C2)$, which is smaller than C1 and C2. When a negative ESD surge is placed on the pad 18, the reverse diode 26 turns on and sinks the ESD current.

Figure 10:
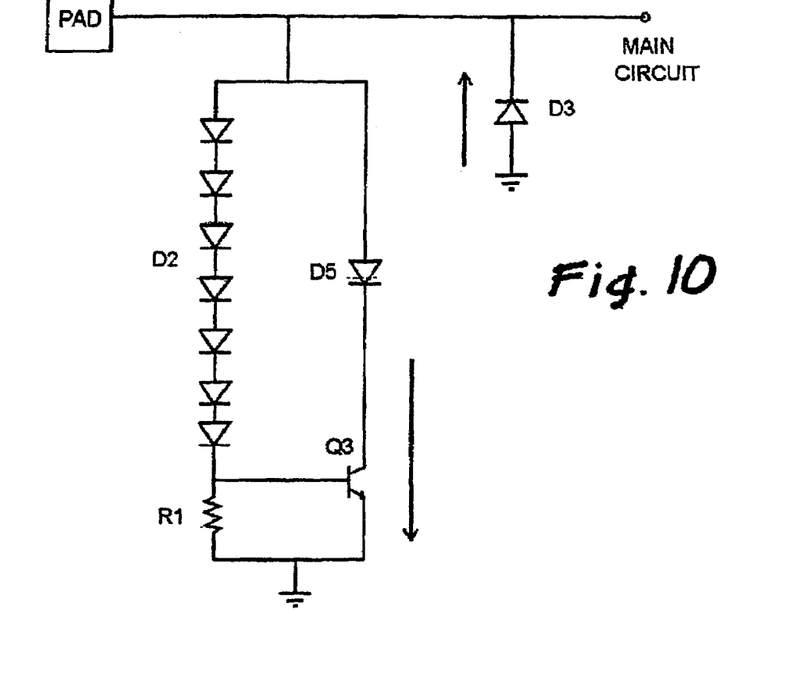
FIG. 10 is a schematic diagram of an alternative embodiment of the invention where a bipolar transistor is substituted for the Darlington pair.

This approach for an ESD protection circuit is compared to a similar approach shown in FIG. 10. This second approach uses a single bipolar transistor 28 instead of a Darlington pair 16 to sink the peak ESD current. The ESD protection circuit using Darlington pair 16 has three advantages over the ESD protection circuit using a single bipolar transistor 28. First, the Darling pair 16 can increase the current drive from the diode string 14, resulting in a small size for the diodes. As a result, both approaches use about the same amount of area. Second, the Darlington pair 16 also minimizes the variation of the ESD protection circuit performance due to transistor current gain variation, which can be induced by either process or temperature variation. Typically, current gain can be varied as much as 100% due to process variations. Third, by using a diode 20 and a resistor 22 in series to turn on the Darlington pair 16, the leakage current is lower, hence improving efficiency and linearity.

Figure 11:
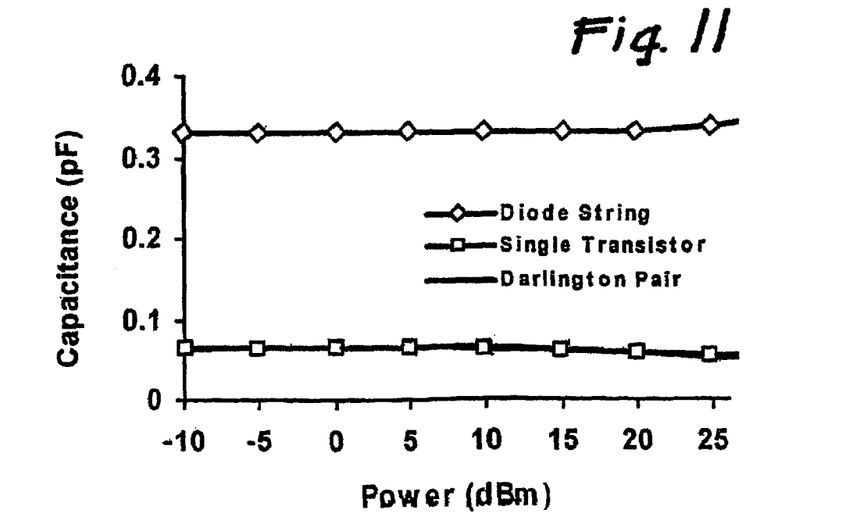
FIG. 11 is a graph of the capacitance as a function of power (dBm) of the circuits of FIGS. 2, 5 and 10.

In order to validate the proposed ESD protection circuit, the Agilent's Advanced Design System (ADS) was used for RF circuit simulation as well as real time ESD waveform simulation. GaAs foundries provide the HBT models. The device area was first optimized for $2000V_{ESD}$ protection. The RF performance for the three ESD protection circuits is simulated and compared. FIG. 11 shows the capacitance contribution as a function of power (dBm) for the three ESD protection circuits with 20-ohm termination. The single transistor 27 and Darlington pair 16 embodiments have the same capacitive loading. The capacitance from the diode string is the highest, while the Darlington pair 16 and the single bipolar approaches are the same.

Figure 17:
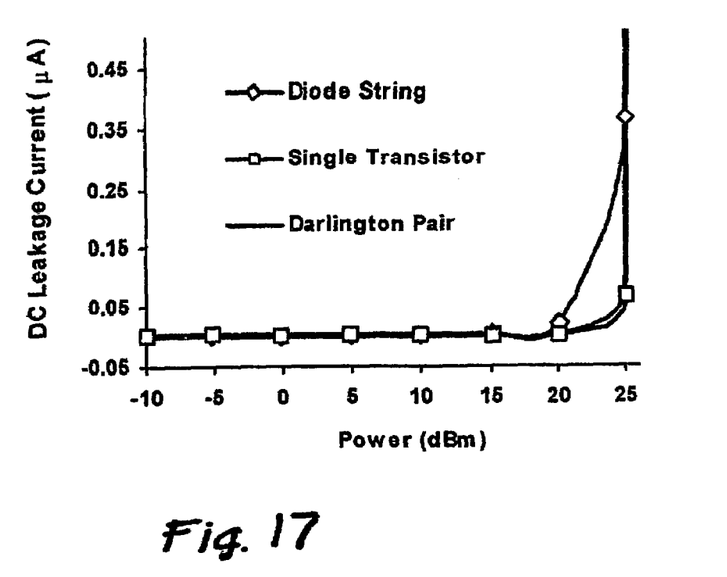
FIG. 17 is a graph of the DC leakage current as a function of the RF power for each of the circuits of FIGS. 2, 5 and 10.

Tables 1 and 2 show the leakage current for 1 mW and 1W at 1950 MHz with a 12-ohm loading termination respectively. The Darlington pair approach has the least leakage ESD current while the diode string approach has the most leakage current. FIG. 17 is a graphic depiction of the DC leakage current as a function of the RF power for each of the circuits of FIGS. 2, 5 and 10, showing that the embodiments using the single transistor 27 and the Darlington pair 16 have substantially the same DC leakage current.

TABLE 1

| ESD Protection Approach | Leaking current |
| --- | --- |
| Diode String | 0.11 μA |
| Darlington Pair | 0.018 μA |
| Single Bipolar | 0.034 μA |

TABLE 2

| ESD Protection Approach | Leaking current |
| --- | --- |
| Diode String | 3 mA |
| Darlington Pair | 1 mA |
| Single Bipolar | 1 mA |

Figure 12:
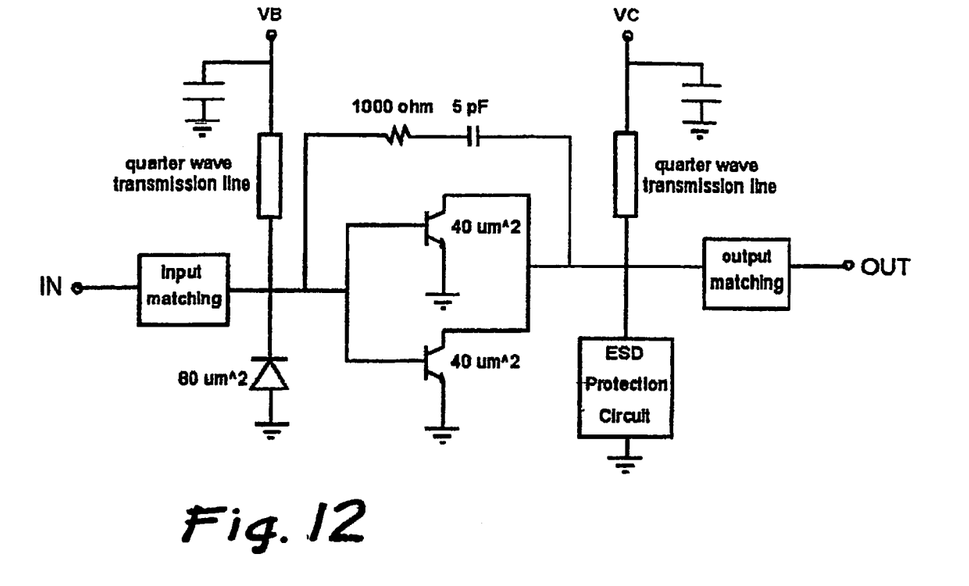
FIG. 12 is a schematic of a single stage 10 GHz amplifier simulated for RF performance with the ESD protection circuit of the invention and prior art.

To demonstrate how the capacitance loading affects the circuit RF performance, a single stage amplifier with 80 mm² emitter area, tuned for 10 GHz as shown in FIG. 12, is simulated with an ESD protection circuit 30 of the invention as shown in FIG. 5. Table 3 shows the power gain, 1-dB power compression and power added efficiency.

TABLE 3

| Frequency: 10 GHz | Power Gain | P1dBm | PAE at P1dBm |
| --- | --- | --- | --- |
| Without any ESD protection | 7.7 | 18.55 | 35.8 |
| Diode string ESD protection | 7.38 | 17.83 | 29.91 |
| Darlington Pair ESD Protection | 7.61 | 18.45 | 34.62 |

Figure 13A:
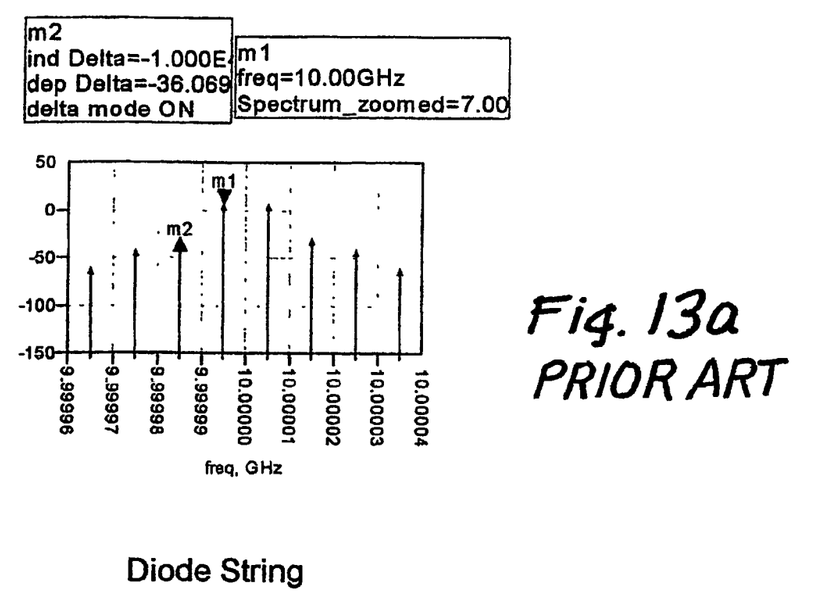
FIGS. 13a and 13b are graphs showing the third order intermodulation product for a single stage amplifier at 10 GHz using the protection circuit of the prior art and invention respectively.
Figure 13B:
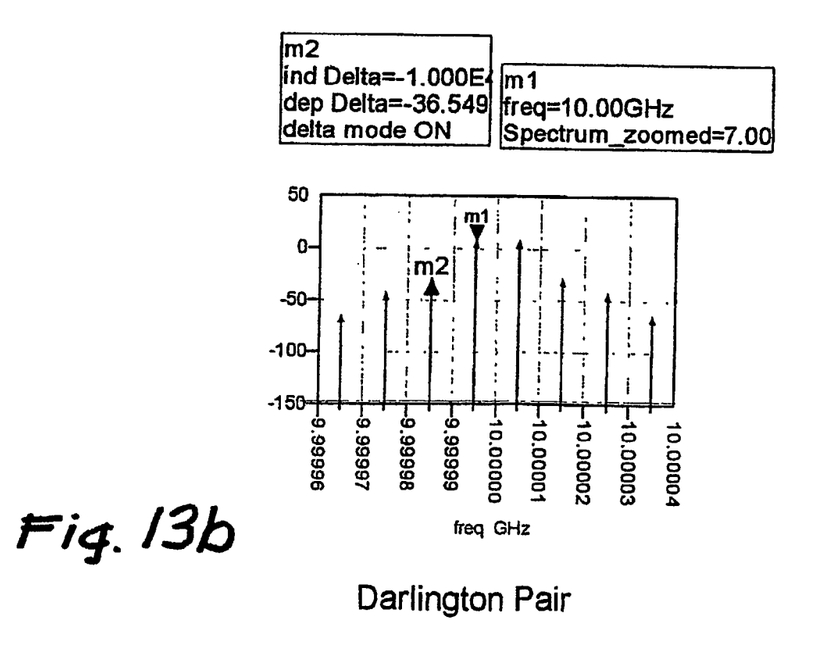

FIG. 13 illustrates the improvement in third order intermodulation product with the Darlington pair approach over the diode string approach. Overall, the degradation of the RF performance is smaller in the Darlington approach.

Figure 18A:
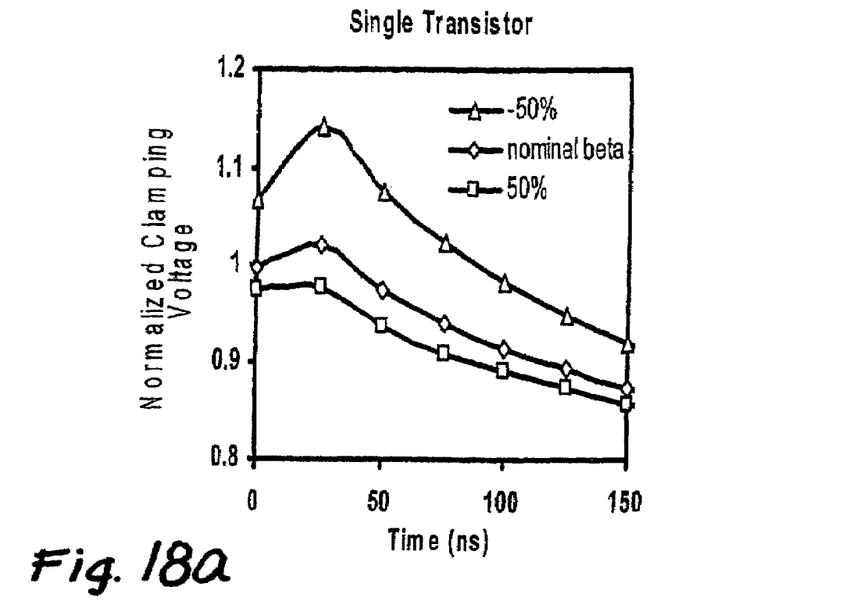
FIGS. 18a and 18b are graphs of the $\beta$ effect on clamping voltage for the single transistor and Darlington pair embodiment respectively as a function of time for the nominal $\beta$ and plus or minus 50% above and below the nominal value.
Figure 18B:
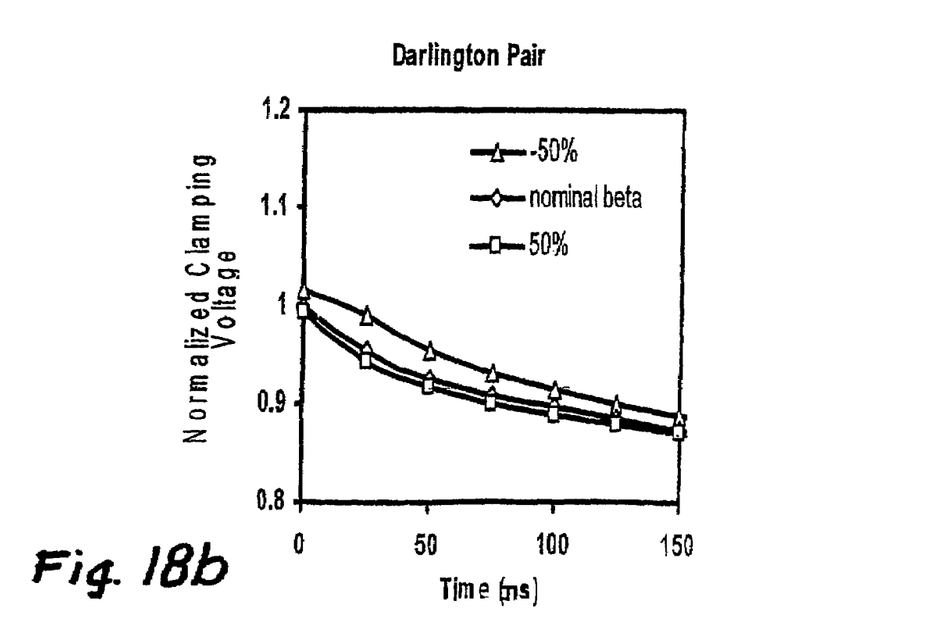
Figure 19A:
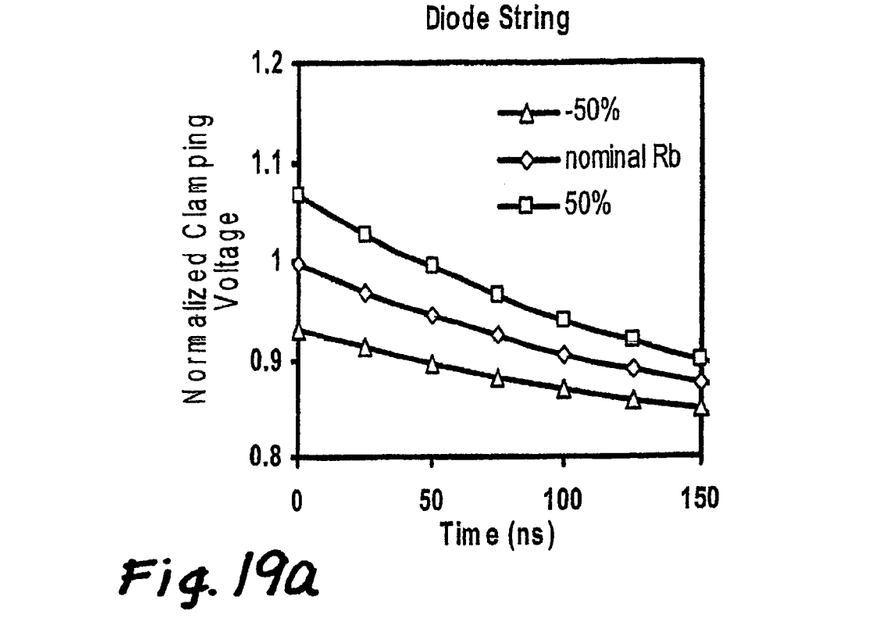
FIGS. 19a and 19b are graphs of the base resistance, $R_b$, effect on clamping voltage for the diode string and Darlington pair embodiment respectively as a function of time for the nominal $R_b$ and plus or minus 50% above and below the nominal value.
Figure 19B:
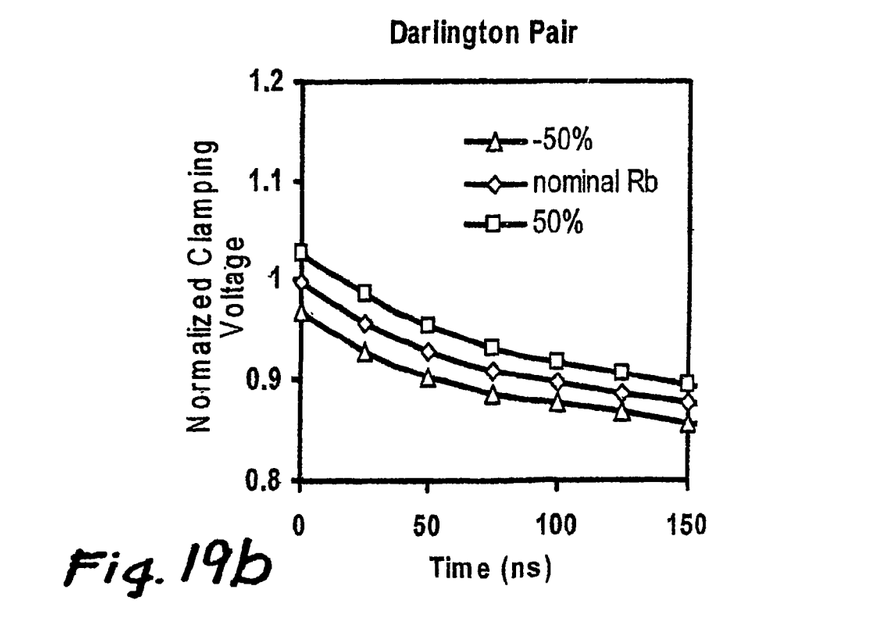

FIGS. 18a and 18b are graphs of the β effect on clamping voltage for the single transistor and Darlington pair embodiment respectively as a function of time for the nominal β and plus or minus 50% above and below the nominal value. FIGS. 19a and 19b are graphs of the base resistance, $R_b$, effect on clamping voltage for the diode string and Darlington pair embodiment respectively as a function of time for the nominal Rb and plus or minus 50% above and below the nominal value. As depicted, a 100% swing in the value of β or $R_b$ causes a swing of less than 15% in the clamping voltage in the worst of cases.

Figure 20:
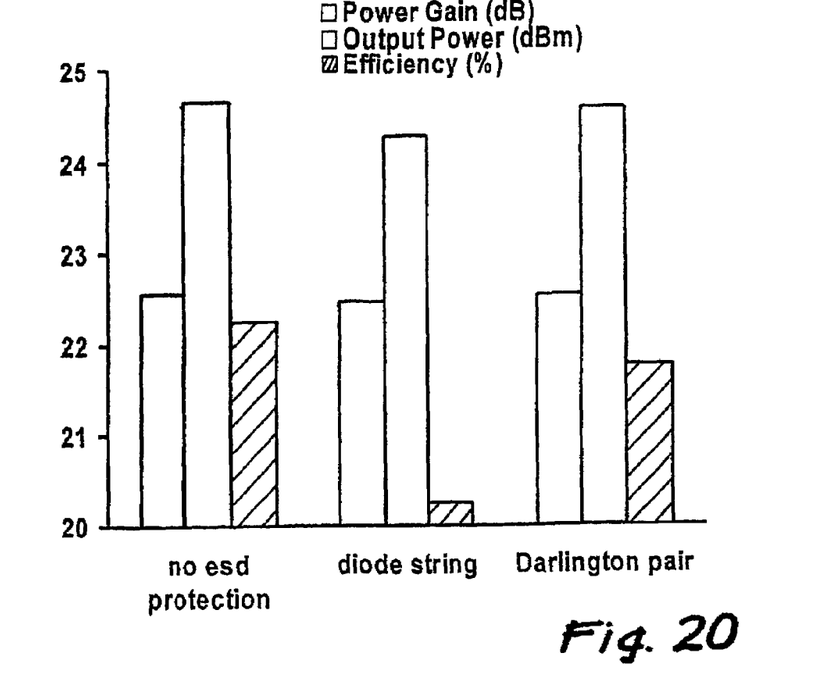
FIG. 20 is a bar graph comparing the power gain, output power and efficiency of a 5.8 GHz wireless LAN power amplifier with no ESD protection and with ESD protection from a diode string and from a Darlington pair embodiment.
Figure 21:
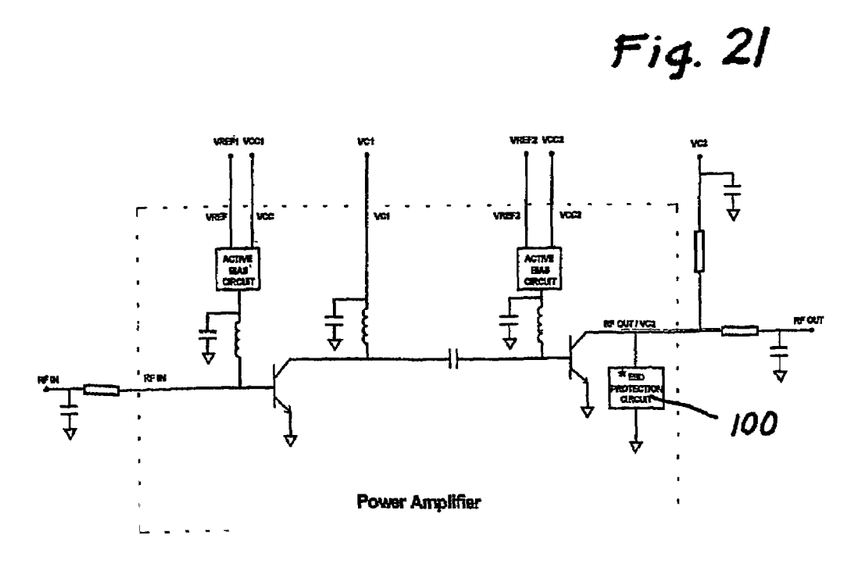
FIG. 21 is a circuit diagram of the 5.8 GHz wireless LAN power amplifier assumed in the comparison of FIG. 20.

FIG. 21 is a circuit diagram of the 5.8 GHz wireless two-stage LAN power amplifier with an ESD protection circuit 100, if any. FIG. 20 is a bar graph comparing the power gain, output power and efficiency of a 5.8 GHz wireless LAN power amplifier with no ESD protection and with ESD protection from a diode string and from a Darlington pair 16 inserted for ESD protection circuit 100. It can be seen that there is substantially no loss of efficiency arising by use of the Darlington pair 16 as compared to the case where no ESD protection is inserted.

Figure 22:
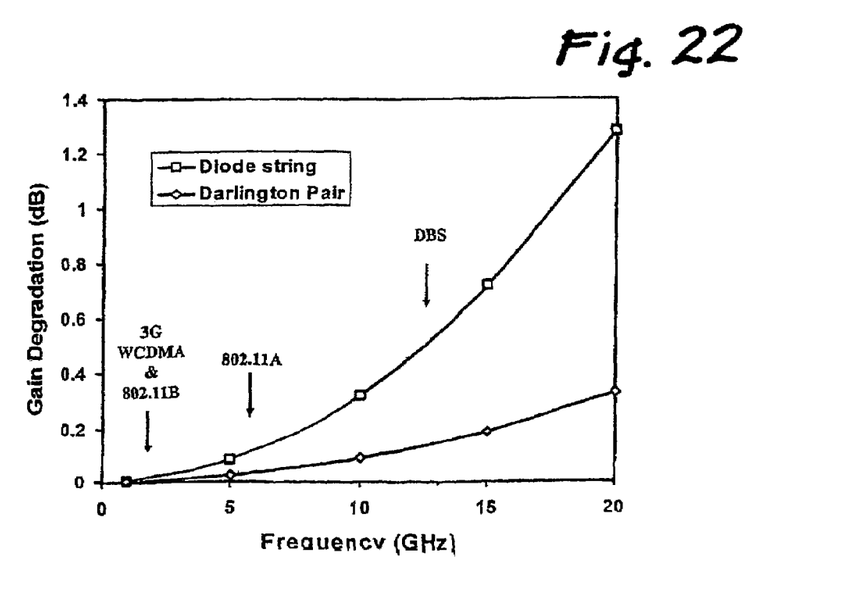
FIG. 22 is a graph of the degradation in power gain as a function of frequency, which arises by use of the diode string or Darlington pair as an ESD protection circuit.

FIG. 22 is a graph of the degradation in power gain as a function of frequency which arises by use of the diode string or Darlington pair 16 as an ESD protection circuit. It is readily apparent that the degradation in power gain is substantially less with the Darlington pair 16 as compared to the diode string at higher RF frequencies.

Figure 23:
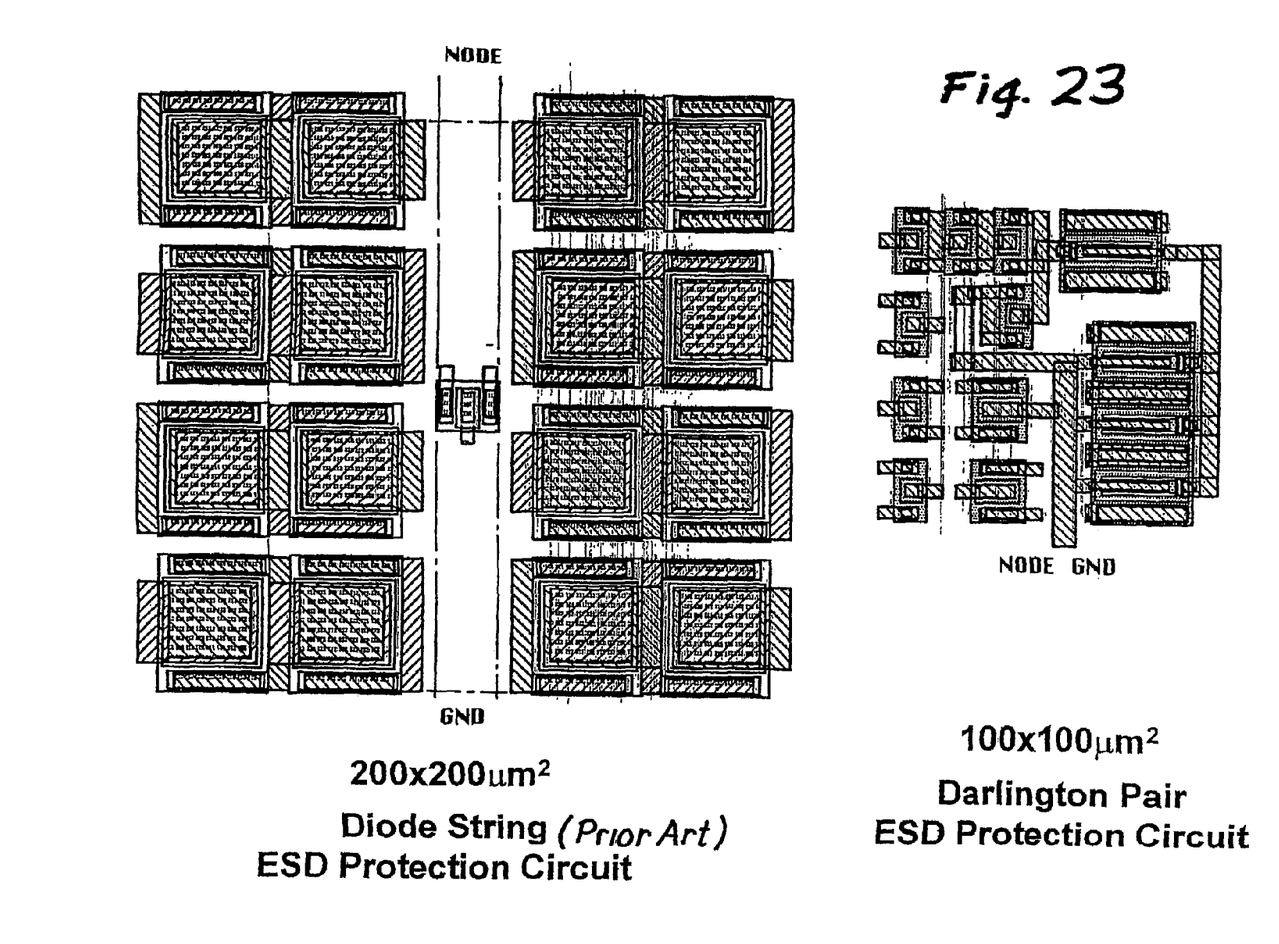
FIG. 23 is a layout comparison of the Darlington pair and the diode string embodiments.

Finally, FIG. 23 shows a comparison of the layout of the Darlington pair 16 and the diode string embodiments. As shown, the Darlington pair 16 is one fourth the size of the diode string. Because of its small size, it can be fit between bonding pads in the unused chip space in most conventional layouts without any penalty to die size.

In summary, the ESD protection circuit of the illustrated embodiment uses a low capacitance diode string 14 to trigger a Darlington pair 16, which used for sinking the ESD current. Based on the simulation, the Darlington ESD protection circuit has good RF performance, including output power, power gain, and power added efficiency, and good linearity, due to its low capacitance loading and leakage current. It has the lowest capacitance reported. It also uses much smaller area than the conventional diode string ESD protecting circuit of FIG. 2.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An electrostatic discharge protection circuit for an input/output signal terminal in an integrated circuit, coupled to ground comprising:
    a diode string coupled to the input/output signal terminal;
    a transistor switch having its gate coupled to the diode string, the transistor switch coupling the input/output signal terminal to ground in parallel to the diode string;
    a reverse diode coupling ground to the input/output signal terminal; and
    a capacitive element in series with the transistor switch to reduce the capacitance contributed by the transistor switch, thereby reducing signal distortion
    where the transistor switch comprises a Darlington pair and further comprising a series diode and a series resistor combined in any order and coupled between the gate of the transistor switch and the diode string on one hand and ground on the other hand
    whereby voltage overload protection for RF power amplifiers is provided for the conditions of (1) output impedance mismatch, (2) RF overdrive, and (3) modulated input signal.

2. An integrated electrostatic discharge protection circuit for an input/output signal terminal in an integrated RF circuit comprising:
    a diode string coupled to the input/output signal terminal;
    a Darlington pair having its gate coupled to the diode string, the Darlington pair coupling the input/output signal terminal to ground in parallel to the diode string;
    a series diode;
    a series resistor, where the series diode and the series resistor are coupled in series with each other to reduce the leakage current at low and medium RF power operation and their combination is coupled between the gate of the Darlington pair and diode string on one hand and ground on the other hand;
    a diode in series with the Darlington pair to reduce the capacitance contributed by the Darlington pair, thereby reducing signal distortion; and
    a reverse diode coupling ground to the input/output signal terminal where the diode string is forward biased on the application of positive ESD events at the input and the reverse diode is forward biased on the application of negative ESD events at the input,
    whereby voltage overload protection for RF power amplifiers is provided for the conditions of (1) output impedance mismatch, (2) RF overdrive, and (3) modulated input signal.

3. A method for providing electrostatic discharge protection for an input/output signal terminal of an integrated circuit comprising:
    sinking a first type of ESD event to ground from the input/output signal terminal through a diode string coupled to the input/output signal terminal by triggering a transistor switch having its gate coupled to the diode string, the transistor switch coupling the input/output signal terminal to ground in parallel to the diode string;
    sinking a second type of ESD event through a reverse diode coupling ground to the input/output signal terminal; and
    coupling the input/output signal terminal to ground during ESD protection by means of a capacitive element in series with the transistor switch to reduce the capacitance contributed from the transistor switch .thereby reducing signal distortion
    where triggering the transistor switch comprises triggering a Darlington pair; and
    where triggering the Darlington pair comprises coupling the first type of ESD event through the diode string to the gate of the Darlington pair while also coupling the first type of ESD event through the diode string to a series diode and resistor to ground to prevent the ESD protection circuit from turning on during low to moderate RF power operation, therefore minimizing leaking current and improving linearity.

4. A method for providing electrostatic discharge protection for an input/output signal terminal of an integrated circuit comprising:
    sinking a first type of ESD event to ground from the input/output signal terminal through a diode string coupled to the input/output signal terminal by triggering a transistor switch having its gate coupled to the diode string, the transistor switch coupling the input/output signal terminal to around in parallel to the diode string;
    sinking a second type of ESD event through a reverse diode coupling around to the input/output signal terminal; and
    coupling the input/output signal terminal to ground during ESD protection by means of a capacitive element in series with the transistor switch to reduce the capacitance contributed from the transistor switch, thereby reducing signal distortion
    where coupling the input to ground during ESD protection comprises coupling the input to ground by means of a diode in series with a Darlington pair to reduce the capacitance contributed from the Darlington pair, thereby reducing signal distortion.

5. A method for providing electrostatic discharge protection comprising:
    sinking a first type of ESD event to ground from an input through a diode string coupled to the input/output signal terminal by triggering a Darlington pair having its gate coupled to the diode string, the Darlington pair coupling the input to ground in parallel to the diode string, where coupling the first type of ESD event through the diode string to the gate of the Darlington pair also couples the first type of ESD event through the diode string to a series diode and resistor to ground to prevent the ESD protection circuit from turning on during low to moderate RF power operation, therefore minimizing leaking current and improving linearity, while also coupling the input/output signal terminal to ground during the ESD protection by means of a diode in series with the Darlington pair to reduce the capacitance contributed to the diode string from the Darlington pair, thereby reducing signal distortion; and
    sinking a second type of ESD event through a reverse diode coupling ground to the input/output signal terminal; and
    coupling the input/output signal terminal to ground during ESD protection by means of a capacitive element in series with the transistor switch to reduce the capacitance contributed from the transistor switch, thereby reducing signal distortion.

6. The method of claim 5 where the first type of ESD event is a positive voltage surge applied to the input, and the second type of ESD event is a negative voltage surge applied to the input.

7. The method of claim 5 where the first type of ESD event is a negative voltage surge applied to the input, and the second type of ESD event is a positive voltage surge applied to the input.

8. An electrostatic discharge protection circuit for an input/output signal terminal in an integrated circuit, coupled to ground comprising:
- a diode string coupled to the input/output signal terminal;
- a transistor switch having its gate coupled to the diode string, the transistor switch coupling the input/output signal terminal to ground in parallel to the diode string;
- a reverse diode coupling ground to the input/output signal terminal; and
- a capacitive element in series with the transistor switch to reduce the capacitance contributed by the transistor switch, thereby reducing signal distortion
- wherein the transistor switch and diode string each have a chip-layout size and where the chip-layout size of the transistor switch and diode string when used in combination is smaller than the chip-layout size of a diode string when used alone, which used-alone diode string provides substantially the same ESD protection as the transistor switch and diode string in combination as characterized by the maximum clamping voltage of the electrostatic discharge protection circuit
- whereby voltage overload protection for RF power amplifiers is provided for the conditions of (1) output impedance mismatch. (2) RF overdrive, and (3) modulated input signal.

9. The electrostatic discharge protection circuit of claim 8 wherein the electrostatic discharge protection circuit is disposed in unused space on a chip between adjacent bonding pads.

* * * * *